United States Patent
Ochiai

(10) Patent No.: US 7,605,475 B2
(45) Date of Patent: Oct. 20, 2009

(54) SEMICONDUCTOR DEVICE

(75) Inventor: Isao Ochiai, Ota (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 11/086,990

(22) Filed: Mar. 23, 2005

(65) Prior Publication Data
US 2005/0218526 A1  Oct. 6, 2005

(30) Foreign Application Priority Data
Mar. 25, 2004 (JP) ............... 2004-088266

(51) Int. Cl.
H01L 23/48 (2006.01)
H01L 23/52 (2006.01)
H01L 29/40 (2006.01)

(52) U.S. Cl. ..................................... 257/774

(58) Field of Classification Search ......... 361/306; 357/74; 257/774, 664–677, E23.021–E23.079, 257/41, 81, 82, 91, 99, 177–182, 276, 457, 257/459, 502, 503, 573, 584, 602, 621, 688–700, 257/734–786, E23.141–E23.179; 438/613–617
See application file for complete search history.

(56) References Cited

U.S. PATENT DOCUMENTS

| | | | |
|---|---|---|---|
| 5,095,402 A * | 3/1992 | Hernandez et al. | 361/306.2 |
| 5,939,779 A * | 8/1999 | Kim | 257/692 |
| 6,132,543 A | 10/2000 | Mohri et al. | |
| 6,168,969 B1 | 1/2001 | Farnworth | |
| 6,181,000 B1 * | 1/2001 | Ooigawa et al. | 257/676 |
| 6,498,389 B1 * | 12/2002 | Kim | 257/673 |
| 6,943,442 B2 * | 9/2005 | Sunohara et al. | 257/700 |
| 6,979,904 B2 * | 12/2005 | Farnworth et al. | 257/777 |
| 2002/0041027 A1 * | 4/2002 | Sugizaki | 257/737 |
| 2002/0127839 A1 * | 9/2002 | Umetsu et al. | 438/618 |
| 2003/0107119 A1 * | 6/2003 | Kim | 257/686 |
| 2004/0021139 A1 | 2/2004 | Jackson et al. | |
| 2004/0113261 A1 * | 6/2004 | Sunohara et al. | 257/700 |

FOREIGN PATENT DOCUMENTS

JP  08-051179  2/1996
KR  2001-0064908 A  7/2001

* cited by examiner

Primary Examiner—Dao H Nguyen
Assistant Examiner—Tram H Nguyen
(74) Attorney, Agent, or Firm—Morrison & Foerster LLP

(57) ABSTRACT

The invention reduces outside dimensions of a semiconductor device mounted with a semiconductor die on an external connection medium and minimizes degradation of electrical characteristics of the semiconductor device. The semiconductor device of the invention having a semiconductor die and a lead frame with a plurality of lead terminals has following features. The semiconductor die has a plurality of pad electrodes formed on its front surface, at least one via hole penetrating the semiconductor die, a columnar electrode electrically connected with the pad electrode through the via hole, and a protrusion electrode electrically connected with the columnar electrode. At least one of the lead terminals of the lead frame is formed extending to a position connectable with the protrusion electrode, being connected with the protrusion electrode.

5 Claims, 4 Drawing Sheets

SEMICONDUCTOR DEVICE

CROSS-REFERENCE OF THE INVENTION

This invention is based on Japanese Patent Application No. 2004-088266, the content of which is incorporated by reference in its entirety.

BACKGROUND OF THE INVENTION

1. Field of the Invention

This invention relates to a semiconductor device, particularly to a semiconductor device with a semiconductor die mounted on an external connection medium.

2. Description of the Related Art

Conventionally, a mold package formed by sealing a semiconductor die with a sealing member of epoxy resin and so on has been known as a packaging technology of a semiconductor die such as an IC (Integrated Circuit). In such a packaging technology, the semiconductor die is mounted on an island portion of a lead frame which is an external connection medium and connected with a lead terminal of the lead frame, before sealed with the sealing member. Next, a conventional semiconductor device with the semiconductor die mounted on the lead frame will be described with reference to drawings.

FIG. 5 is a schematic cross-sectional view of the conventional semiconductor device with the semiconductor die mounted on the lead frame. As shown in FIG. 5, pad electrodes 41 are formed on a front surface as a first surface of a semiconductor die 40 (e.g. IC). This semiconductor die 40 is mounted on an island portion 50isd of a lead frame 50. A back surface as a second surface of the semiconductor die 40 is attached to the island portion 50isd. Furthermore, the pad electrodes 41 of the semiconductor die 40 are electrically connected (i.e. bonded) with lead terminals 51 of the lead frame 50 through bonding wires 52 made of gold fine wires.

Although not shown, the lead frame 50 mounted with the semiconductor die 40 is sealed with a sealing member made of, for example, epoxy resin. The relevant technology is disclosed in Japanese Patent Application Publication No. Hei. 08-051179.

In the above semiconductor device, however, the pad electrodes 41 and the lead terminals 51 are connected with the bonding wires 52, causing such a problem that outside dimensions of the semiconductor device becomes large.

Furthermore, since the bonding wires 52 are fine, such a problem occurs that ON-resistance becomes high and high heat generation occurs when the semiconductor device mounted on a printed circuit board is in operation. This results in degradation of electrical characteristics of the semiconductor device.

SUMMARY OF THE INVENTION

The invention provides a semiconductor device that includes a semiconductor die having a via hole, a pad electrode disposed on a front surface of the semiconductor die, a protrusion electrode disposed on a back surface of the semiconductor die and connected to the pad electrode through the via hole, and an external connection medium having a plurality of connection portions. At least one of the connection portions is in contact with the protrusion electrode.

The invention also provides a semiconductor device that includes a semiconductor die, an external connection medium having a plurality of connection portions, and an electrode portion disposed on a back surface of the semiconductor die. The back surface faces the external connection medium. At least one of the connection portions is in contact with the electrode portion.

DETAILED DESCRIPTION OF THE INVENTION

Figure 1:
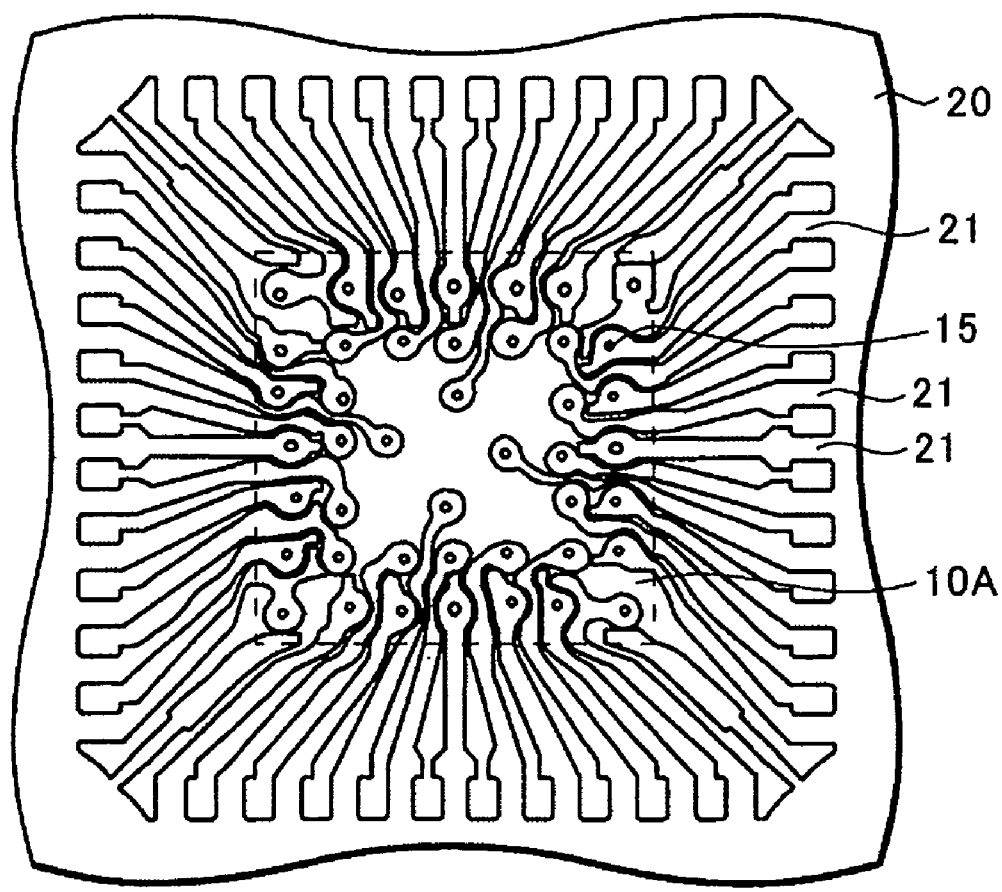
FIG. 1 is top view of a semiconductor device of a first embodiment of the invention.
Figure 2A:
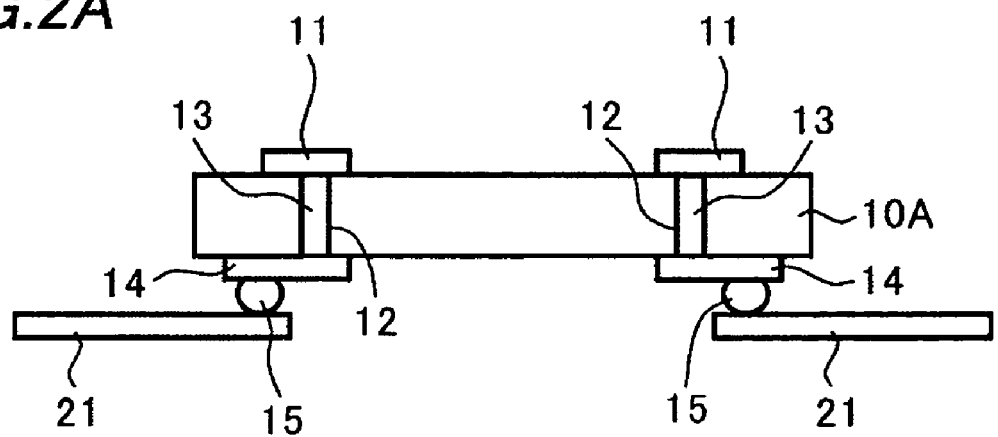
FIGS. 2A and 2B are schematic cross-sectional views of the semiconductor device of FIG. 1.
Figure 2B:
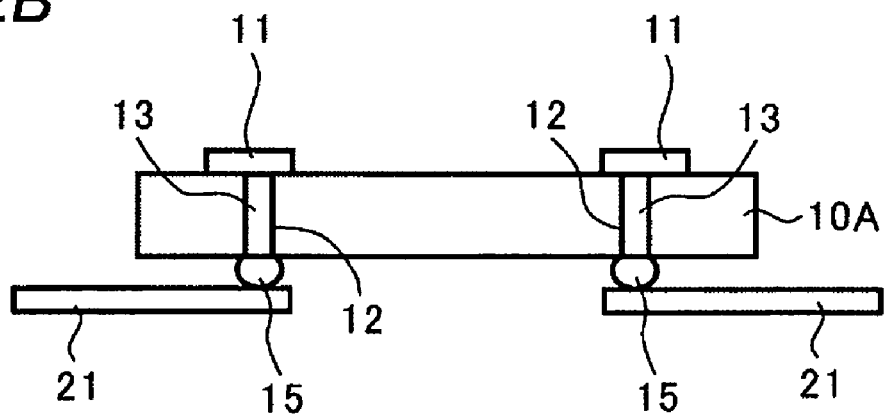

A semiconductor device of a first embodiment of the invention will be described with reference to drawings. FIG. 1 is an upper surface view of a semiconductor device of the first embodiment, showing a lead frame as an external connection medium and its vicinities. FIGS. 2A and 2B are schematic cross-sectional views of the semiconductor device of FIG. 1 from one end to another end thereof.

As shown in FIG. 1, a semiconductor die 10A such as an IC is mounted on a lead frame 20 serving as an external connection medium. Although not shown hereafter, it is preferable that the lead frame 20 mounted with the semiconductor die 10A is sealed with a sealing member such as epoxy resin to form one semiconductor device.

FIG. 1 shows the semiconductor die 10A as a transparent body from its front surface as a first surface to its back surface as a second surface. Pad electrodes 11 are formed on the front surface of the semiconductor die 10A, and a plurality of protrusion electrodes 15 is formed on the back surface of the semiconductor die 10A. This semiconductor die 10A is not limited to the IC, and can be other devices such as a light receiving element.

The lead frame 20 has a plurality of lead terminals 21 serving as connection portions. These lead terminals 21 are formed extending to positions connectable with the protrusion electrodes 15 formed on the back surface of the semiconductor die 10A, respectively. The lead terminals 21 are formed at predetermined intervals apart from each other so as not to occur short-circuit between them.

In a cross-section of this semiconductor device shown schematically in FIG. 2A, the plurality of pad electrodes 11 is formed on the front surface of the semiconductor die 10A. Via holes 12 are formed penetrating the semiconductor die 10A from its back surface to the pad electrodes 11. An insulation film (not shown) made of, for example, an $SiO_2$ film or an SiN film is formed on the back surface of the semiconductor die 10A and on sidewalls of the via holes 12.

The pad electrodes 11 are exposed at bottoms of the via holes 12. A barrier layer (not shown) electrically connected with the pad electrodes 11 is formed on the back surface of the semiconductor die 10A including these via holes 12. This barrier layer is a metal layer made of, for example, titanium nitride (TiN). Alternatively, the barrier layer can be made of metal other than titanium nitride (TiN) as long as the metal functions as a barrier layer. For example, the barrier layer can be made of titanium tungsten (TiW), tantalum nitride (TaN), or a compound of the these metal.

Furthermore, a seed layer (not shown) is formed on the barrier layer. This seed layer is made of copper (Cu), for example, and is a plating electrode for plating for forming columnar electrodes 13 and wiring layers 14 which will be described below. The columnar electrodes 13 and the wiring layers 14 made of, for example, copper (Cu) are formed on the seed layer by plating, for example. The columnar electrodes 13 are formed in the via holes 12, and connected with the pad electrodes 11 through the barrier layer and the seed layer (not shown). The wiring layers 14 are formed on the back surface of the semiconductor die 10A, being connected with the columnar electrodes 13.

Any required number of the wiring layers 14 can be formed extending to required regions on the back surface of the semiconductor die 10A.

Although the columnar electrodes 13 and the wiring layers 14 are formed by plating with copper (Cu), these can be formed by other methods. For example, the columnar electrodes 13 and the wiring layers 14 can be formed by plating with tin (Sn) and then plating with cupper (Cu). Alternatively, the columnar electrodes 13 and the wiring layers 14 can be formed by embedding metal such as copper (Cu) by a CVD method or a MOCVD method. Alternatively, the columnar electrodes 13 and the wiring layers 14 can be formed by sputtering with metal such as aluminum (Al).

The protrusion electrodes 15 are formed on the wiring layers 14. It is preferable that each of the protrusion electrodes 15 is formed on the wiring layer 14 in a position apart from a position formed with the columnar electrode 13 (i.e. a position formed with the via hole 12). These protrusion electrodes 15 are ball-shaped electrodes made of solder, for example. Alternatively, the material of the protrusion electrodes 15 is not limited to solder, and the protrusion electrodes 15 can have other shapes and be made of other materials. For example, the protrusion electrodes 15 can be electrodes formed by plating. Furthermore, since the protrusion electrodes 15 are formed on the wiring layers 14, the number or the forming position thereof on the wiring layers 14 can be selected appropriately.

In the lead frame 20, the plurality of lead terminals 21 are formed extending to the positions immediately above the protrusion electrodes 15. The lead frame 20 is made of, for example, copper (Cu) or copper alloy, and positions of the lead terminals 21 thereof are patterned by punching. Alternatively, the lead frame 20 can be made of metal other than above, and patterned by methods such as etching other than punching.

Although not shown, end portions of the lead terminals 21 which are on the sides not connected with the protrusion electrodes 15 are aligned along lines parallel to first or second lines of the semiconductor die 10A. On the lead frame 20, the back surface of the semiconductor die 10A and the lead terminals 21 face each other, thereby electrically connecting the protrusion electrodes 15 of the semiconductor die 10A and the lead terminals 21. A sealing member (not shown) such as, for example, epoxy resin is formed so as to cover the surface of the semiconductor die 10A and the lead frame 20.

That is, the semiconductor device of the embodiment is formed by mounting the semiconductor die 10A on the lead frame 20 and by sealing these with the sealing member. The semiconductor device is then mounted on the printed circuit board, and the end portions of the lead terminals 21 which are on the sides not connected with the protrusion electrodes 15 are connected with the connection portions of the printed circuit board.

As described above, in the semiconductor device of the embodiment, the pad electrodes 11 of the semiconductor die 10A and the lead terminals 21 of the lead frame 20 are electrically connected through the columnar electrodes 13 in the via holes 12 and the protrusion electrodes 15 without using bonding wires 52 as seen in a conventional art. Such connection between the pad electrodes 11 and the lead terminals 21 can reduce outside dimensions of the semiconductor device compared with the case using the bonding wires.

Furthermore, the pad electrodes 11 and the lead terminals 21 are connected through the columnar electrodes 13 and the protrusion electrodes 15 which have larger cross-sectional areas and shorter lengths than fine wires such as the bonding wires. Therefore, ON-resistance can be minimized when the semiconductor device mounted on the printed circuit board is in operation.

Furthermore, by the decrease of the ON-resistance, heat generation in operation can be minimized. Since the semiconductor die 10A is in contact with the lead frame 20 without the bonding wires, the lead frame 20 functions as a heat sink. Therefore, heat radiation of the semiconductor device in operation can be improved, compared with the case using the bonding wires for the connection. This can minimize degradation of electrical characteristics of the semiconductor device.

Although not shown, the end portions of the lead terminals 21 which are on the sides not connected with the protrusion electrodes 15 are formed aligning along the first or second sides of the semiconductor device (on lines parallel to the first or second sides of the semiconductor die 10A). Therefore, a pattern of the printed circuit board can be formed in a simple pattern along the first or second sides of the semiconductor device. Even a micro-sized semiconductor die 10A can be mounted on the printed circuit board having a relatively large conductive pattern through the lead frame 20.

When the lead terminals 21 of the lead frame 20 are formed extending to positions formed with the protrusion electrodes 15, the forming process thereof is performed by metal punching, for example. Therefore, the process can performed easily compared with the process of forming a complex pattern on the printed circuit board. This can reduce a manufacturing cost of the semiconductor device compared with the conventional semiconductor device using the bonding wires.

In the first embodiment, although the wiring layers 14 are formed on the back surface of the semiconductor die 10A and the protrusion electrodes 15 are formed on the wiring layers 14, modifications are possible. As shown in the schematic cross-sectional view of FIG. 2B, the protrusion electrodes 15 can be formed directly on upper surfaces of the columnar electrodes 13 exposed at the via holes 12 on the back surface of the semiconductor die 10A.

Figure 3:
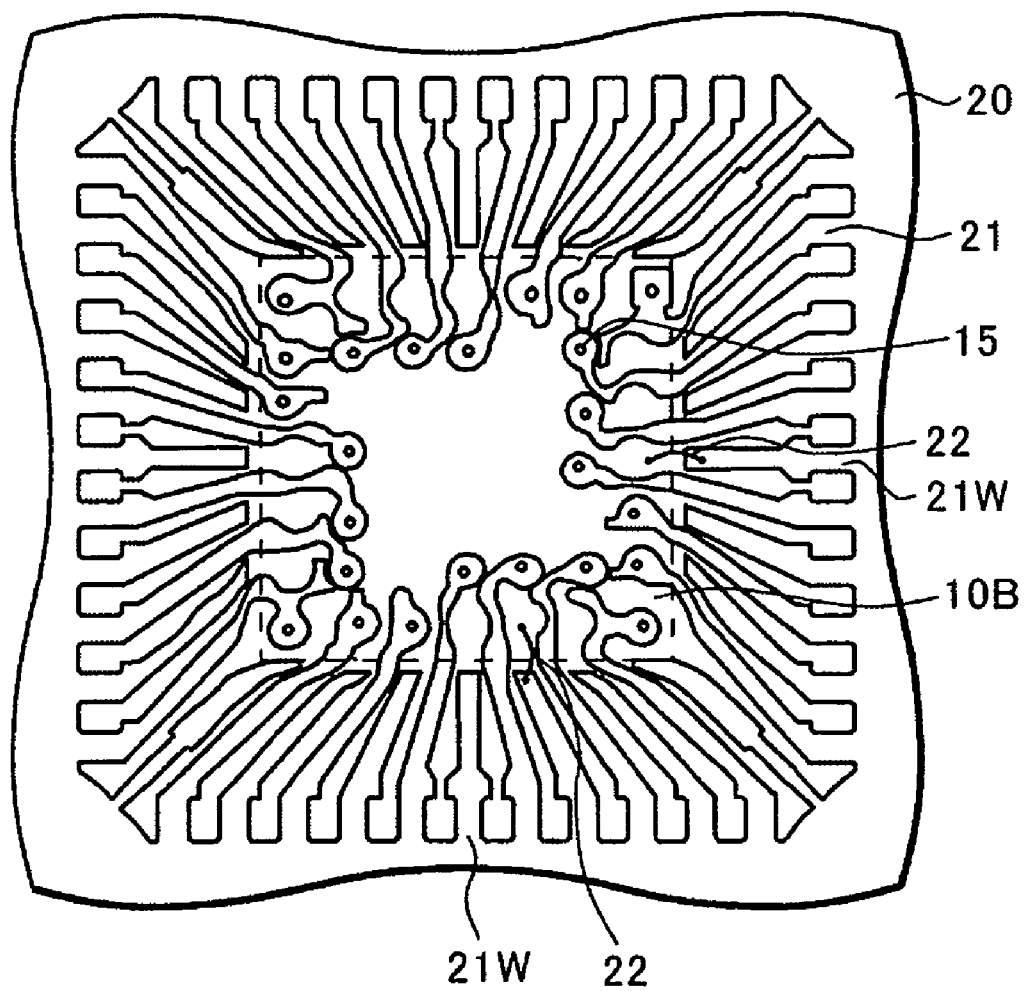
FIG. 3 is a top view of a semiconductor device of a second embodiment of the invention.
Figure 4A:
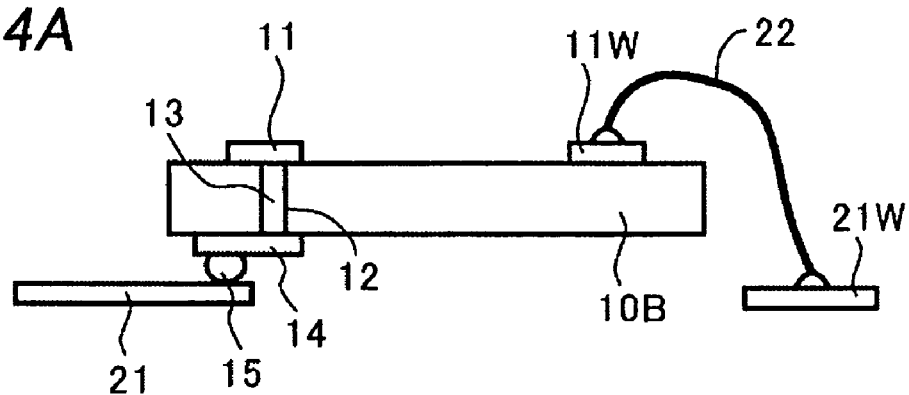
FIGS. 4A and 4B are schematic cross-sectional views of the semiconductor device of FIG. 3.
Figure 4B:
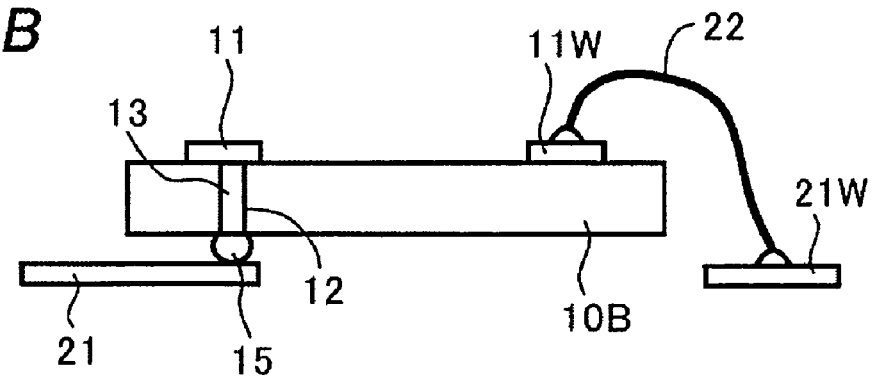
Figure 5:
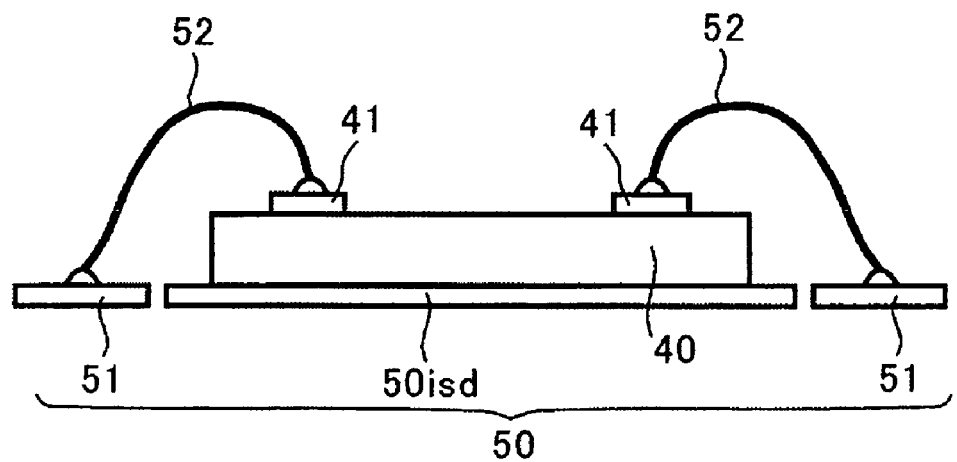
FIG. 5 is a schematic cross-sectional view of a semiconductor device of a conventional art.

Next, a semiconductor device of a second embodiment of the invention will be described with reference to drawings. FIG. 3 is top view of the semiconductor device of the second embodiment, showing a lead frame 20 and its vicinities. FIGS. 4A and 4B are schematic cross-sectional views of the semiconductor device of FIG. 3 form one end to another end thereof. In FIGS. 3, 4A, and 4B, the same numerals are provided to the same elements as the elements of the semiconductor device of the first embodiment shown in FIGS. 1, 2A, and 2B.

As shown in FIG. 3, a semiconductor die 10B such as an IC is mounted on a lead frame 20. Although not shown, it is preferable that the lead frame 20 mounted with the semiconductor die 10B is sealed with a sealing member such as epoxy resin to form one semiconductor device.

A structure of the semiconductor die 10B in this embodiment is different from the one in the first embodiment. Some of a plurality of pad electrodes (not shown) are connected with lead terminals 21w through bonding wires 22 without using protrusion electrodes 15. The lead terminals 21w connected with the pad electrodes through the bonding wires 22 are not necessarily formed immediately above a back surface of the semiconductor die 10B. Other structures of the semiconductor die 10B and the lead frame 20 are the same as those in the first embodiment.

In a cross-section of the semiconductor device, as shown in the schematic cross-sectional view of FIG. 4A, a plurality of pad electrodes 11 and 11w are formed on a front surface of the semiconductor die 10B. In a position corresponding to at least one pad electrode 11 in the semiconductor die 10B, a via hole 12 is formed penetrating the semiconductor die 10B from its back surface to the pad electrode 11. An insulation film (not shown) is formed on a sidewall of the via hole 12 and on the back surface of the semiconductor die 10B near the via hole 12. Furthermore, in a similar manner to the first embodiment, a barrier layer (not shown), a seed layer (not shown), a columnar electrode 13, a wiring layer 14, and a protrusion electrode 15 are formed in the via hole 12 or its vicinity. As shown in the schematic cross-sectional view of FIG. 4B, the protrusion electrode 15 can be formed directly on an upper surface of the columnar electrode 13 exposed at the via hole 12 on the back surface of the semiconductor die 10B without forming the wiring layer 14 on the back surface of the semiconductor die 10B.

The pad electrode 11w in a position not formed with the via hole 12 is connected with the lead terminal 21w through the bonding wire 22. That is, in this embodiment, the pad electrode 11 is connected with the lead terminal 21 through the columnar electrode 13 and the protrusion electrode 15, and the other pad electrode 11w is connected with the lead terminal 21w through the bonding wire 22. Accordingly, the pad electrode and the lead terminal can be connected even in a position inappropriate for formation of the via hole 12 in the semiconductor die 10B.

Although the protrusion electrode 15 is formed on the back surface of the semiconductor die in the first and second embodiments, the invention is not limited to this. That is, although not shown, an electrode portion other than the protrusion electrode can be formed on the back surface of the semiconductor die as long as the electrode portion can be electrically connected with the lead terminal. For example, an electrode portion formed flat and exposed at the same surface as the back surface of the semiconductor die as in an LGA (Land Grid Array) type semiconductor device can be formed instead of the protrusion electrode.

Although the pad electrode 11 and the lead terminal 21 are connected through the columnar electrode 13 embedded in the via hole 12 penetrating the semiconductor die in the semiconductor device of the first and second embodiments, modifications are possible.

In detail, although not shown, it is possible that an embedded electrode layer is formed in the semiconductor die, a via hole is formed from the back surface of the semiconductor die to the embedded electrode layer, a columnar electrode is formed in the via hole, and the embedded electrode layer is connected with a lead terminal through the columnar electrode (the layer can be also connected with the terminal further through a wiring layer and a protrusion electrode). In a case where the pad electrodes are formed on a front surface of the semiconductor die, at least one of the lead terminals can be connected with at least one of the pad electrodes through a bonding wire.

Although the lead frame 20 is used as an external connection medium in the first and second embodiments described above, external connection mediums other than the lead frame 20 can be used as long as the medium has the same function as that of the lead frame 20 and formed with the same conductive pattern. Furthermore, a printed board or a ceramic board can be used as the external connection medium as long as the board has the conductive pattern. For example, instead of the lead frame 20, a flexible printed circuit (FPC) having a conductive pattern can be used. In this case, the connection portion for the semiconductor die is formed on the flexible printed circuit as a conductive pattern.

Furthermore, the lead frame can be punched out so as to connect common Vss terminals (ground terminals) or common Vdd terminals (power supply terminals) of the lead terminals with each other. This can increase electrical characteristics and strength of the lead frame.

What is claimed is:

1. A semiconductor device comprising:
   a die made of a semiconductor and having a via hole;
   a pad electrode disposed on a front surface of the semiconductor die;
   a lead comprising a plurality of lead terminals and not having an island portion to support the semiconductor die;
   a wiring layer disposed on a back surface of the semiconductor die and connected to the pad electrode through the via hole, the back surface facing the lead; and
   a protrusion electrode disposed on the back surface so as to be physically in contact with the wiring layer,
   wherein at least one of the lead terminals is in physically contact with the protrusion electrode,
   the wiring layer extends away from the protrusion electrode, and
   the lead terminal physically in contact with the protrusion electrode extends inwardly in a direction parallel to the front surface of the semiconductor die so as not to overlap the via hole.

2. The semiconductor device of claim 1, wherein the protrusion electrode is disposed away from the via hole.

3. The semiconductor device of claim 1, further comprising a pad electrode disposed on a front surface of the semiconductor die and connected to one of the lead terminals with a wire.

4. The semiconductor device of claim 1, wherein none of the lead terminals of the lead reaches an area under a central portion of the die.

5. A semiconductor device comprising:
   a die made of a semiconductor and having a via hole;
   a pad electrode disposed on a front surface of the semiconductor die;
   a lead body comprising a plurality of elongated lead terminals that converge into a center of the lead body so as to leave an empty space in the center of the lead body;
   a wiring layer disposed on a back surface of the semiconductor die and connected to the pad electrode through the via hole, the back surface facing the lead body; and
   a protrusion electrode disposed on the back surface so as to be in contact with the wiring layer,
   wherein at least one of the lead terminals is physically in contact with the protrusion electrode,
   the wiring layer extends away from the protrusion electrode, and
   the lead terminal physically in contact with the protrusion electrode extends toward the center of the lead body in a direction parallel to the front surface of the semiconductor die so as not to overlap the via hole.

* * * * *